(12) United States Patent
Mengad

(10) Patent No.: US 9,806,698 B1
(45) Date of Patent: Oct. 31, 2017

(54) CIRCUIT AND METHOD FOR A ZERO STATIC CURRENT LEVEL SHIFTER

(71) Applicant: Dialog Semiconductor (UK) Limited, London (GB)

(72) Inventor: Zakaria Mengad, Edinburgh (GB)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/376,751

(22) Filed: Dec. 13, 2016

(51) Int. Cl.
| | |
|---|---|
| *H03K 19/094* | (2006.01) |
| *H03K 19/0175* | (2006.01) |
| *H03K 3/356* | (2006.01) |
| *H03K 19/0185* | (2006.01) |

(52) U.S. Cl.
CPC ........... *H03K 3/356113* (2013.01); *H03K 19/018521* (2013.01)

(58) Field of Classification Search
CPC ............ H03K 3/356113; H03K 19/018521
USPC ............................ 326/81, 80, 68; 327/333
See application file for complete search history.

(56) References Cited

U.S. PATENT DOCUMENTS

| | | | | |
|---|---|---|---|---|
| 4,801,819 A | * | 1/1989 | Theus .................. | H03K 3/0375 326/28 |
| 5,539,334 A | * | 7/1996 | Clapp, III ........ | H03K 3/356017 326/30 |
| 6,456,110 B1 | | 9/2002 | Elamanchili et al. | |
| 6,487,687 B1 | | 11/2002 | Blake et al. | |
| 6,646,469 B2 | | 11/2003 | Yushan | |
| 6,842,043 B1 | | 1/2005 | Nguyen et al. | |
| 7,026,855 B2 | * | 4/2006 | Sueoka ................. | H03K 5/153 326/68 |
| 7,301,370 B1 | * | 11/2007 | Hanna ................ | H03K 19/0948 326/68 |
| 2006/0220682 A1 | * | 10/2006 | Satou ............... | H03K 3/356165 326/80 |

\* cited by examiner

*Primary Examiner* — Daniel D Chang
(74) *Attorney, Agent, or Firm* — Saile Ackerman LLC; Stephen B. Ackerman

(57) ABSTRACT

In summary, a level shift circuit, comprising an input in low voltage domain and an output in a high voltage domain, a first and second gating device coupled to said input, a first and second error sensing devices coupled to a said first and second gating devices, respectively, a logic block configured to monitor a state of said output and to control of said first and second gating devices, and wherein said first and second error sensing devices are coupled to a memory device configured to store said state of said output. In addition, a method of a level shift circuit, comprising the steps of a first step (a) providing an input in a low voltage domain, an output in a high voltage domain, first and second gating device, first and second error sensing device, a logic block, and a memory device, a second step (b) sensing errors in said first and second error devices, a third step (c) monitoring a state of said output of said first and second gating devices, a fourth step (d) controlling a state of said first and second gating devices, and a fifth step (e) storing said state of said output in said memory device.

16 Claims, 14 Drawing Sheets

CIRCUIT AND METHOD FOR A ZERO STATIC CURRENT LEVEL SHIFTER

BACKGROUND

Field

The disclosure relates generally to an apparatus and, more particularly, to a circuit and method of a level shifter thereof.

Description of the Related Art

Modern high voltage switching power stages make extensive use of Double Diffused MOSFET or DMOS transistors. For both the high side and the low side power FETs, the maximum gate drive for both P-type and/or N-type devices is limited; a power device could tolerate e.g. 12V from drain to source/body, but with a gate voltage breakdown voltage at 5V. This limitation requires almost systematically the use of a level shifter from low voltage to high voltage domain and vice-versa. In this disclosure, the two voltage levels for the high voltage domain are represented as VDH (upper voltage) and VSH (lower voltage), with the two voltage levels for the low voltage domain represented as VDL (upper voltage) and VSL (lower voltage), FIG. 1 illustrates an example of a prior art level shifting network known to the inventor. When the high side (HS) device is an N-type device (e.g. metal oxide semiconductor field effect transistor (MOSFET), the level shifter virtual ground is the fast switching output, the virtual ground rail (VSH) will switch very fast from the VSL to VDL. This switching is a major source of coupling between supply domains that makes the fast and reliable transmission of the input signal to the output a challenging task. The level shifting network 100 consists of a flying level shifter 110 and 140. The Flying Level Shifter 110 receives a signal from the Gate Sense High Side 120. A "Break Before Make" Control 130 receives a signal from the Flying Level Shifter 110 and Gate Sense Low Side 170, and provides an output signal to Flying Level Shifter 140 and Output Pre-drive network 160. A Flying Level Shifter 140 provides an output signal for pre-drive network 150. A first n-channel MOSFET 180 provides a switch device between VDD and output, and a second n-channel MOSFET 190 provides a switch device between VSL and output.

One of the main requirements for this type of level shifters is propagation time; this is because of the limited dead time budget (which is in the order of 10 ns). It is important to minimize dead time for efficiency and linearity performance. Additionally, other issues could be also important depending on the application, (a) permanent or DC sensing of the error between input and output; (b) insensitivity to supply rails switching (no glitches); (c) low dynamic power consumption and no static current consumption; (d) scalable and reusable; and (e) small size.

Level shift circuits can be classified into two different types. Type A has a permanent direct current (d. c.) path between the input and output supply domains. Type B is a non-permanent d. c. path between the input and output supply domains. FIG. 2 shows an example of Type A. The network consists of two input MOSFET pull-down devices, N1 210A and N2 210B electrically coupled to a cascode structure 230. The two MOSFET pull-up devices are P1 220A and P2 220 B. A logic gate 240 is powered by power signals VDH and VSL, whose output signal is VOUT 250. The MOSFET input devices N1 210A and N2 210B continue to drive the triggering current until the output voltage transitions to the same polarity as the input voltage (the output voltage does not necessarily need to be stored with a latching structure). But a resistive path must necessarily exist between the input voltage domain and the output voltage domain.

One of the main advantages is a relatively simple design procedure and a fairly safe operation, as previously stated before, the current from the input devices N1 210A and N2 210B would continue to force the transition until the output state follows. If an external event causes the output to change state, then the input devices would drive against that change until the output follows the state of the input polarity.

In most cases that a cascode structure will exist between the input devices drains, and the output voltage domain devices MOSFETs P1 220A and P2 220B. The cascode structure requires generally floating isolated wells. The floating isolated well increases the size (e.g. chip area) and slows down the level shifter due to additional parasitic junction capacitances that need to be charged and discharged during the transition. The level shifter circuit can be designed for high speed operation but generally requires a few nanoseconds (ns) of propagation time; this requires additional feed-forward capacitors. With the addition of capacitors, there is inherent drawbacks, leading to design circuit and layout re-design for optimization.

The triggering charge, current or voltage is transmitted to the output voltage domain only for some time after the transition of the input voltage; the output information must then necessarily be stored using a latching structure. A type of level shifter in this classification is the current mode pulsed level shifters.

FIG. 3 illustrates a dynamic, capacitive or clock level shifter that is known to the inventor. This level shifter 300 is a well-known structure commonly used in charge pumps to shift a square signal like a clock, VDL-VSL voltage is pumped to the high voltage domain due to Cp/Cn (Cp 330 and Cn 340 respectively) in a push-pull mode. A first inverter 310 is coupled to a non-inverting gate 320 and capacitors Cp 330 and Cn 340; circuit inverter 310 and non-inverting 320 are logic buffers based on a cascade of inverting logic gates Capacitors Cp 330 and Cn 340 charge and discharge into the output nodes of latch 350/360 to cause to transition, after that the latch holds its state until the input buffers under VDL/VSL change polarity again. This type of level shifters requires a reset signal under VDH/VSH domain 370 and output 380 to determine the initial state of the latch. Note that latching structure 350/360 form a latching structure that is a memory element that will define the state when the supply is applied for the first time. The practice is to use a power on reset (POR) circuit to force the latch into a known state.

One of the main advantages of the capacitive coupled level shifter is its high speed and low complexity; this is a result of that all the circuitry never sees a voltage differential more than VDL-VSL or VDH-VSH. As a result, it can be implemented using only standard low voltage devices which saves area, has also a good scalability, and the capacitors don't add too much loading capacitance for their small size. Additionally, in most of the cases, active devices can be placed underneath Cp/Cn.

One of the main limitations and disadvantage of this type of level shifter is the latch sensitivity to the fast switching of the supply rails VSH/VDH. The normal operation is that the capacitors Cp/Cn would provide a "feed-forward" state of 310/320 to the output of the latch. But this switching characteristic raises two concerns. The first concern and disadvantage is substantial transients of the latch outputs during VDH/VSH switching caused by charge/discharge of Cp and Cn into those nodes, whilst the VSL/VDL domain signals are static. When VSH/VDH switch is extremely fast, the capacitors Cp/Cn tend to corrupt the state of the latch 350/360. Those undesirable transients can be detected and filtered using additional combinatorial logic and latching circuitry (however, it adds power consumption and delays further the propagation of the signal to the output). The second disadvantage is related to the charge/discharge current from Cp/Cn (whilst the input state is stable) into the latch circuit, causing systematically forward current in the back-gate diodes. This increases the risk of CMOS latch-up.

FIG. 4 shows a prior art example of current mode pulsed level shifter circuit. The current mode pulsed level shifter circuit 410 has a pulse generator 410 coupled to a current source Pulse_P 420A and Pulse_N 420B. The current sources VCL1 420A and VCL2 420B provide current to I2V 430A, and I2V 430B. These are coupled to current sources VCI3 440A, and VCI4 4440B, respectively. A latch 450A/450B provides signals to non-inverting gates 460A and 460B providing positive and negative logic states of VO. One other type B LS is shown in FIG. 4, commonly called pulsed level shifters because the signal is transmitted to the output voltage domain in the form of a pulse (current) that gets converted into voltage information, which is subsequently stored using a regenerative structure having latched outputs LTCHP/LTCHN. Note that this is similar to the latchup formed by 350/360 in FIG. 3.

The pulse generator has in important role in this type of level shifters, as it has to generate a deterministic signal at its outputs where the state of the output voltage domain are guaranteed to be consistent with the input. For example, it must not allow a very short stimuli from the input (IN) to propagate to the current sources as this might generate an unknown result on the output; therefore delaying and deglitching circuits are often used to eliminate that risk. The disadvantage and drawback of this practice is a significant increase in the propagation time for legitimate inputs.

In addition, once the decision to generate the pulse is made, then the designer is left with the question of how long the pulse duration should be. As the answer to this question depends strongly on supply voltages, temperature and process corners, designers are left with only one option which is to take margin and set the pulse duration long enough to guarantee that the output will go through a full transition; this conservative approach is a disadvantage and another limitation where propagation time is increased even further.

FIG. 5 illustrates a prior art circuit known the inventors. FIG. 5 illustrates an inherent open loop operation, where the input signal error converts into a latching signal error; but the output signal does not interfere with the operation of the latching path. The MOSFET N1 520A and N2 520B are electrically coupled to VSL 510 in the VDL/VSL domain. The pull-up P-type MOSFETs P1 530A and P2 530B whose gates are inter-connected, and additionally coupled to the MOSFET pull-downs N1 520A and N2 520B. The outputs of P1 530A and P2 530B are coupled to full-latch 540A/540B, as well as De-Glitch network 550. The output of the De-Glitch network 550 is coupled to non-inverting logic 560 with output signal OUTPUT 580. The output OUTPUT 580 is merely the result of the latch transition, the De-glitcher 550 illustrated here is also open loop, where its output is entirely determined by its inputs. If we examine for example the operation of P1 530A starting with Vm='high'=VDH, initially when INB is toggled 'high' (and IN is 'low') P1 530 A will conduct current from the left-hand side of the latch to VSL; Vin will start to transition towards VSH and once it reaches VSH P1 530A will naturally turn off and only the latch is maintaining the state of Vm/Vp.

In summary, type A level shifter circuits are relatively slow, while type B level shifter circuits are relatively fast, but do not offer the desired d.c. path between input/output supply domains. The speed of Type A level shifters can be improved by introducing Type B design techniques at the cost of silicon area. Additional disadvantages of existing art techniques using a reasonable area cause undesirable coupling to the output supply domain circuitry, when either the input (or output) supply domain is switching, and/or undesirable coupling to the output supply domain circuitry when either the input (or output) supply domain is switching. These undesirable couplings could cause output false triggering and CMOS latch-up. Note by preventing the first disadvantage, de-glitching circuitry is added; adding de-glitching circuitry slows down the level shifter. To prevent the latter disadvantage, the layout and devices isolation issues are required.

A new type of operation that is desirable includes an operation that minimizes propagation time without being sensitive to the switching of the supply rails yet having a permanent error sensing between the output and the input signal. A level shift circuit with lower dynamic power consumption and small area is desired.

A level shifter circuit and method of fabrication that satisfies these requirements that does not introduce significant additional mask levels, additional cycle time, and cost is desired.

U.S. Pat. No. 6,842,043 to Nguyen et al., describes a level shifter providing fast operation when changing state while generating little crowbar current. With the use of additional transistors allow the input signals to operate more quickly on the output nodes.

U.S. Pat. No. 6,456,110 to Elamanchili et al., describes a voltage level shifter having zero d.c. current and state retention. Additional transistors are activated when the system is in drowsy mode so as to cut the d.c. current drain and to latch outputs to ignore extraneous inputs.

U.S. Pat. No. 6,487,687 to Blake et al., shows a level shifter circuit with testable cascade devices, including multiple cascode devices and switches. Testability devices coupled to cascode devices of the level shifter detect a current in response to failure of corresponding devices.

U.S. Pat. No. 6,646,469 to Yushan describes a high voltage level shifter with capacitors. A circuit for driving a half bridge driver using capacitors with a floating high side in half-bridge configuration is shown.

In these prior art embodiments, solutions improve level shift circuit characteristics utilized various alternative solutions.

SUMMARY

It is desirable to provide a level shifter circuit with permanent d.c. error sensing between the output and the input.

It is desirable to provide a level shifter circuit with ultra-fast operation.

It is desirable to provide a level shifter circuit with immunity to either input or output supply rail switching and coupling transients.

It is desirable to provide a level shifter circuit with zero static current consumption and very low dynamic power consumption.

It is desirable to provide a level shifter circuit with true symmetrical propagation between rise time and fall time.

A principal object of the present disclosure is to propose a method of switching a level shifter circuit with ultra-fast operation, immunity to supply rail switching and coupling transients, symmetrical propagation of rise and fall time and low power consumption.

In summary, a level shift circuit, comprising an input in low voltage domain and an output in a high voltage domain, a first and second gating device coupled to said input, a first and second error sensing devices coupled to a said first and second gating devices, respectively, a logic block configured to monitor a state of said output and to control of said first and second gating devices, and wherein said first and second error sensing devices are coupled to a memory device configured to store said state of said output.

In addition, a method of a level shift circuit, comprising the steps of a first step (a) providing an input in a low voltage domain, an output in a high voltage domain, first and second gating device, first and second error sensing device, a logic block, and a memory device, a second step (b) sensing errors in said first and second error devices, a third step (c) monitoring a state of said output of said first and second gating devices, a fourth step (d) controlling a state of said first and second gating devices, and a fifth step (e) storing said state of said output in said memory device.

Other advantages will be recognized by those of ordinary skill in the art.

BRIEF DESCRIPTION OF THE DRAWINGS

The present disclosure and the corresponding advantages and features provided thereby will be best understood and appreciated upon review of the following detailed description of the disclosure, taken in conjunction with the following drawings, where like numerals represent like elements, in which.

DETAILED DESCRIPTION

Figure 1:
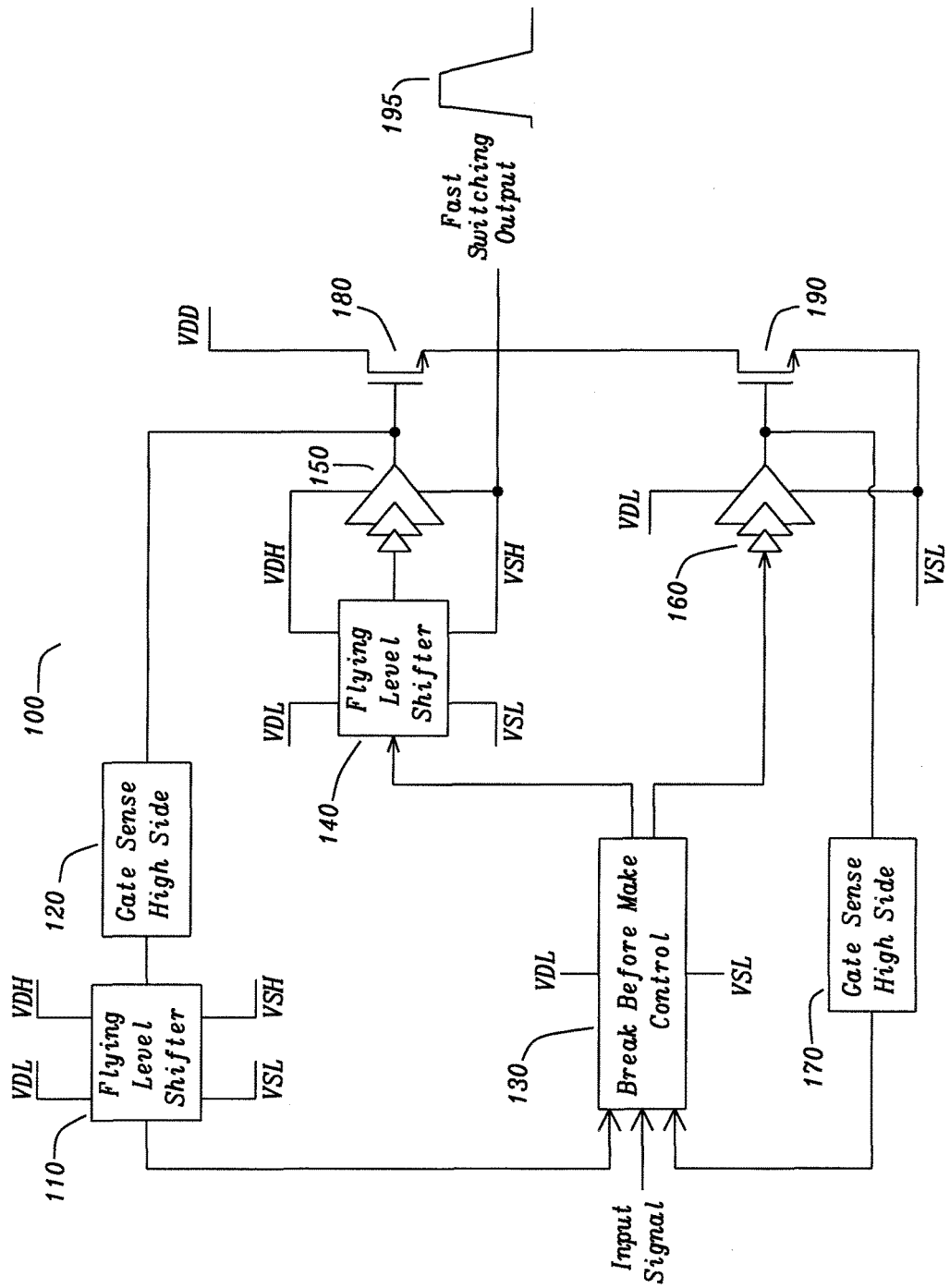
FIG. 1 is a prior art level shift circuit known to the inventors.
Figure 2:
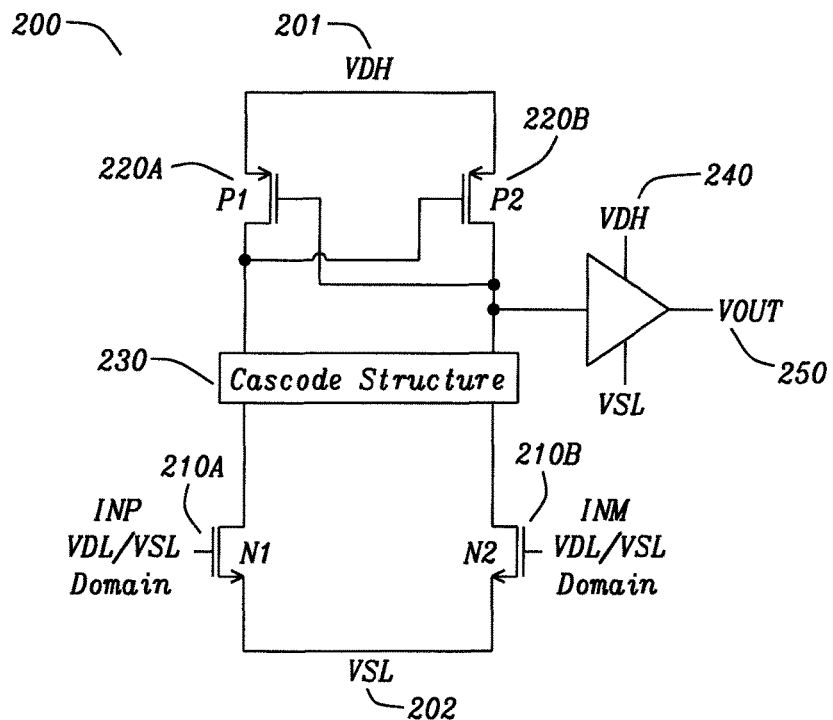
FIG. 2 is a prior art Type A level shift circuit known to the inventors.
Figure 3:
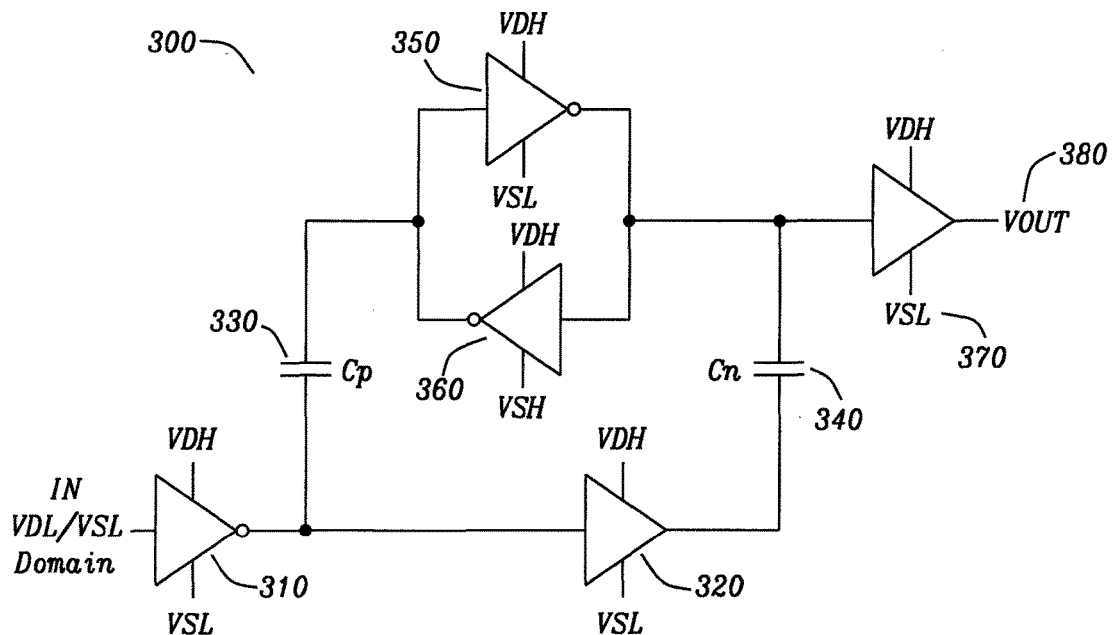
FIG. 3 illustrates a prior art dynamic, capacitive or clock level shifter that is known to the inventors.
Figure 4:
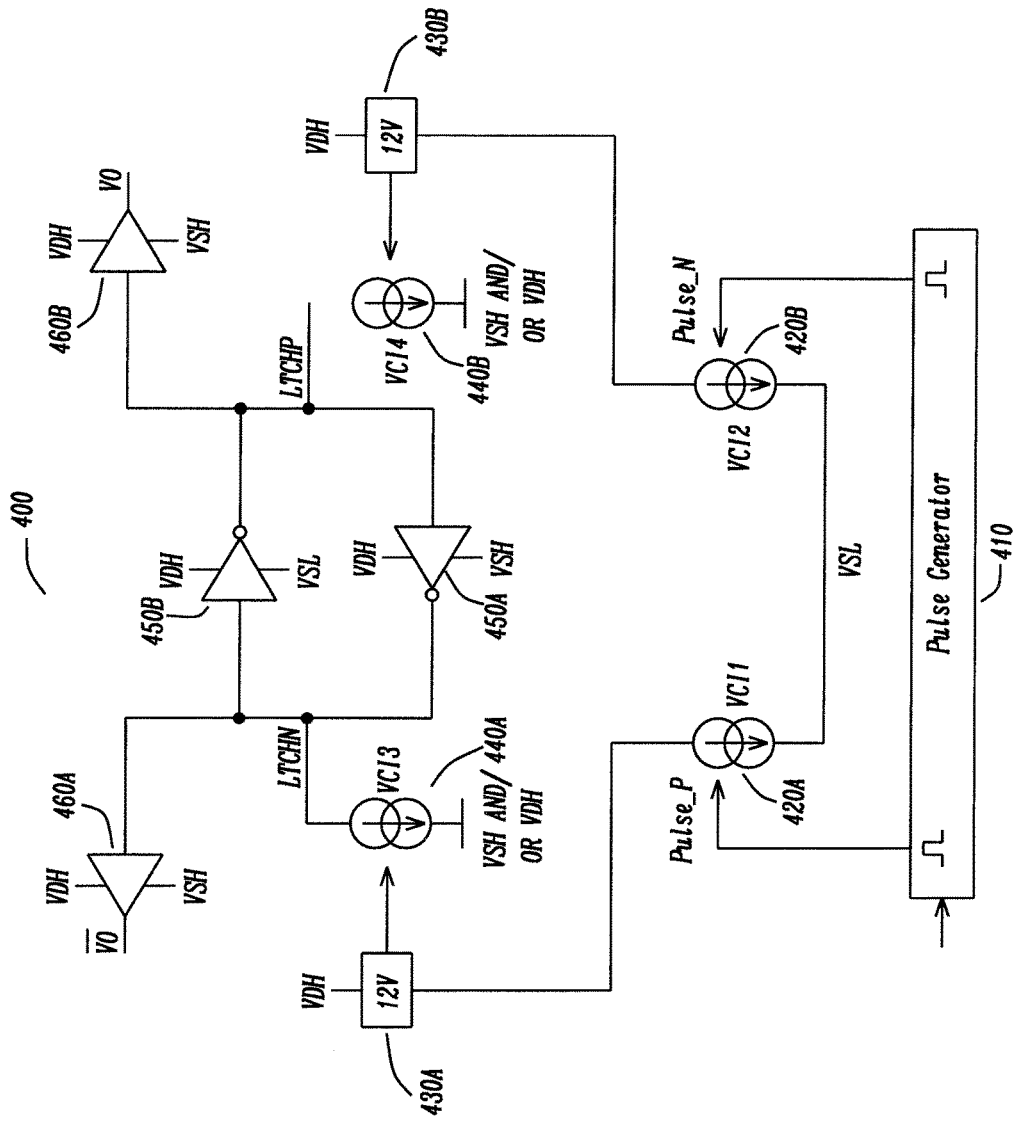
FIG. 4 shows a prior art current mode pulsed level shifter circuit that is known to the inventors.
Figure 5:
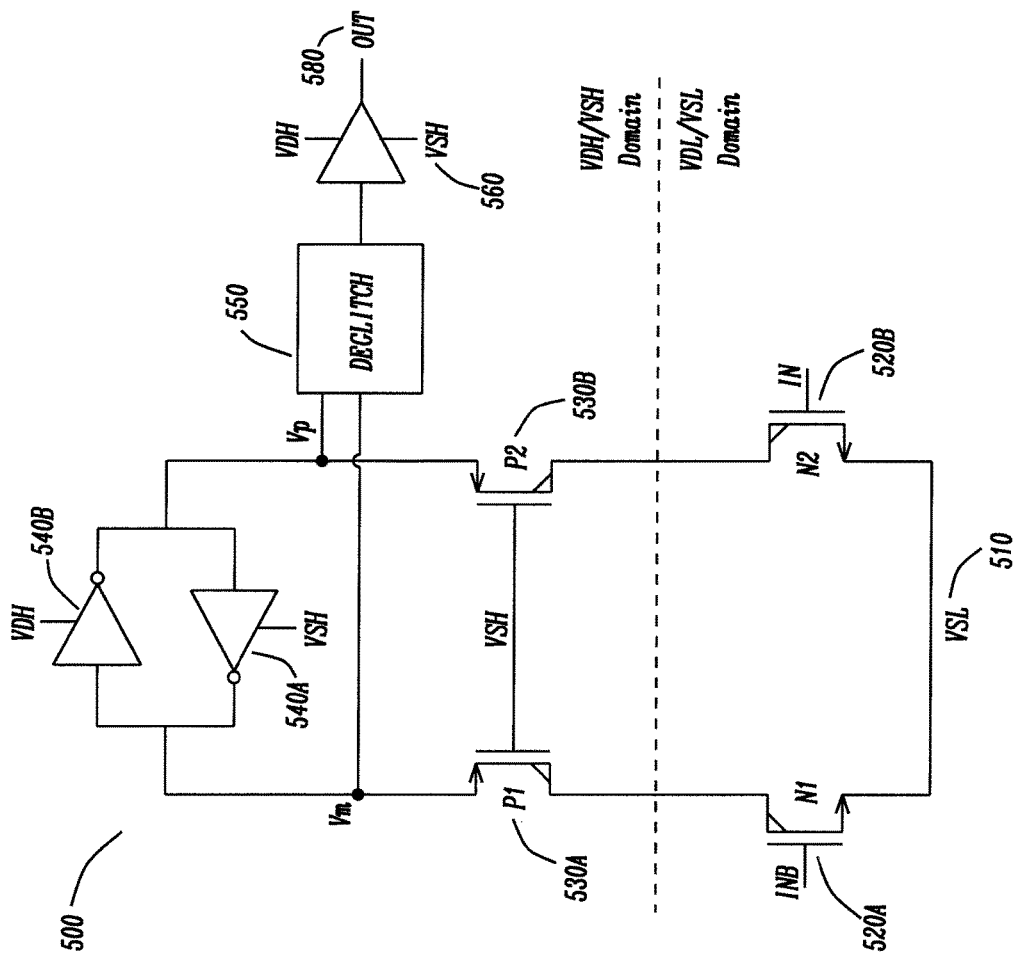
FIG. 5 illustrates a prior art circuit known the inventors.
Figure 6A:
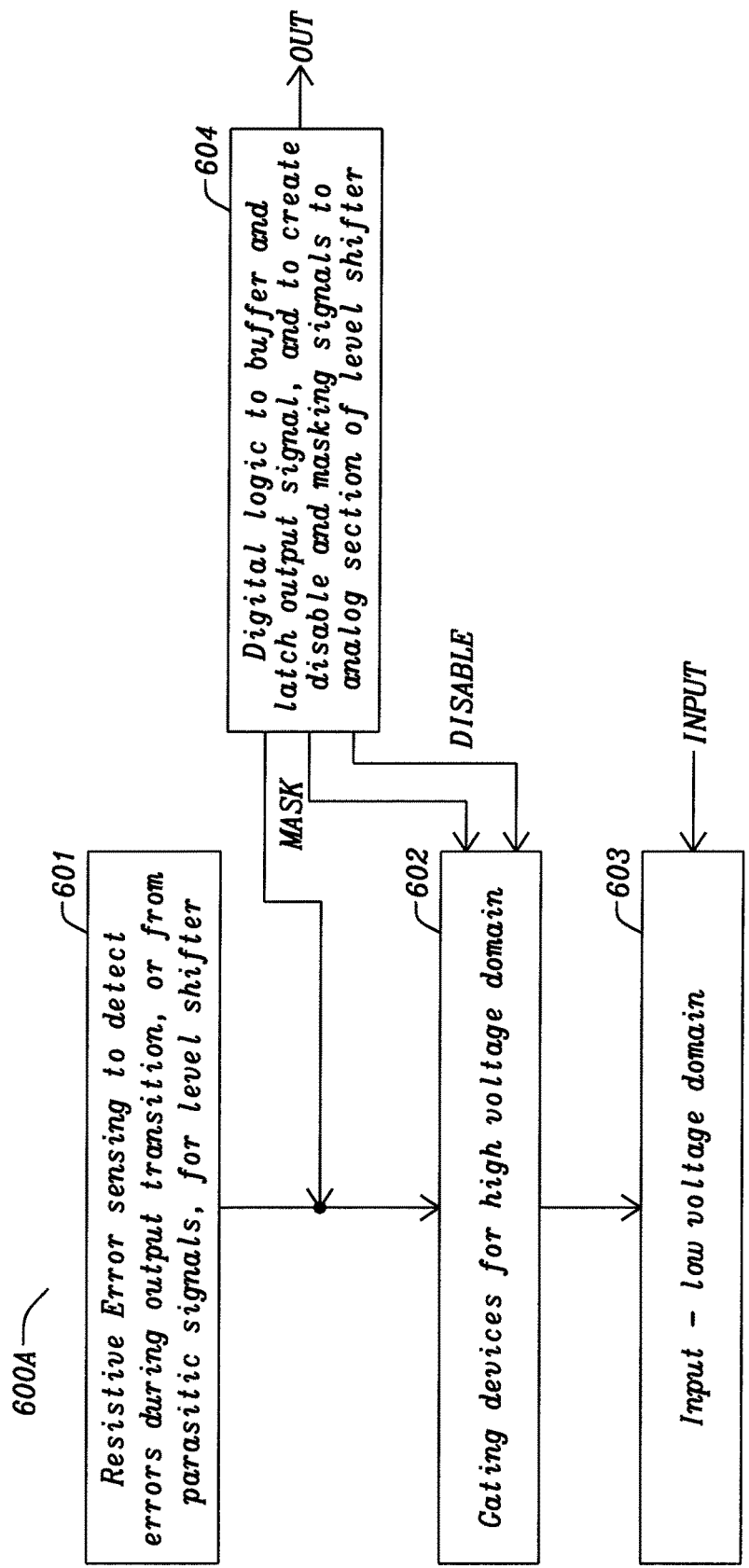
FIG. 6A is a high level diagram in accordance with a first embodiment of the disclosure.

FIG. 6A is a high level diagram in accordance with a first embodiment for the zero static current level shifter of the disclosure. This represents the disclosed level shifter 600A at a system level. The level shifter includes an analog section including a resistive error sensing 601, gating devices 602 for the high voltage domain, and an input as part of the low voltage domain 603. A digital section 604 includes a mask/disable function. The resistive error sensing portion 601 detects errors during output transitions, or from parasitic signals. The digital logic section 604 buffers and latches the output voltage, and to provides disable and masking signals to the analog section of the level shifter.

Figure 6B:
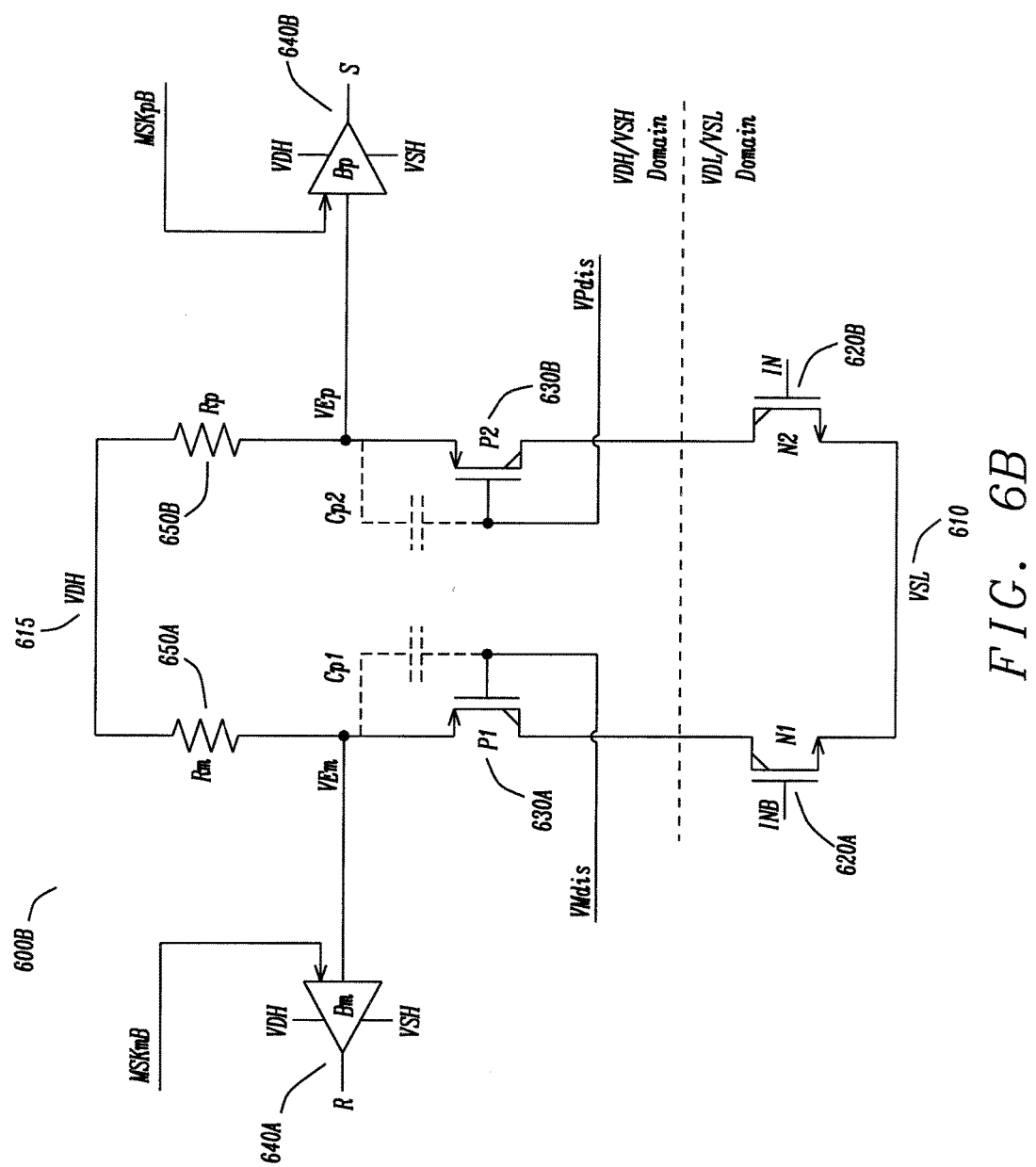
FIG. 6B is an analog circuit in accordance with a first embodiment of the disclosure.

FIG. 6B is a level shifter circuit analog core in accordance with a first embodiment of the disclosure. FIG. 6 illustrates an analog core 600B of a level shift network. FIG. 6 has a low voltage level VSL 610 coupled to the n-channel MOSFETs N1 620A and N2 620B in the low voltage domain. Typical voltages in the low voltage domain would be 0 volts for VSL and 3.3 or 5 V, as examples, for VDL. These are coupled to p-channel MOSFETs P1 630A and P2 630B in the high voltage domain. Typical voltages in the high voltage domain would be 0 volts for VSH and 12 volts, for example, for VDH. Alternately, VDH/VSH in the high voltage domain could be a flying, or dynamic supply, where the difference between VDH and VSH is small (e.g., 3 volts) and where VDH/VSH move together within a larger range of voltages. In this network the gates of P1 630A and P2 630B are not coupled or interconnected, and are coupled to disable signals VMdis and VPdis, respectively. The gate to source capacitance of P1 630A and P2 630B is capacitance Cp1, and capacitance Cp2, respectively. Transistor P1 630A source is coupled to a resistor Rm 650A. Transistor P2 630B source is coupled to resistor Rp 650B. The source node between P1 630A and resistor Rm 650A is coupled via error signal Vem to logic gate 640A and provides an output signal R. The source node between P2 630B and resistor Rp 650B is coupled via error signal Vep to logic gate 640B and provides an output signal S. The power rail VDH 615 is coupled to the two resistors Rm 650A and Rp 650B. The logic gates 640A and 640B have masking signal inputs MSKmB and MSKpB. The protecting MOSFET devices P1 630A and P2 630B are act as gating devices by receiving feedback disable signals VPdis & VMdis. Note that if VPdis is driven high, the transistor P1 is turned off which will gate the current flowing into Rp. The signal VMdis has the same gating effect on current flowing into Rm. Note that gated logic buffers are introduced Bp/Bm before signals R and S generation. The masking signal levels MSKp and MSKm are also local feedback signals.

Figure 7:
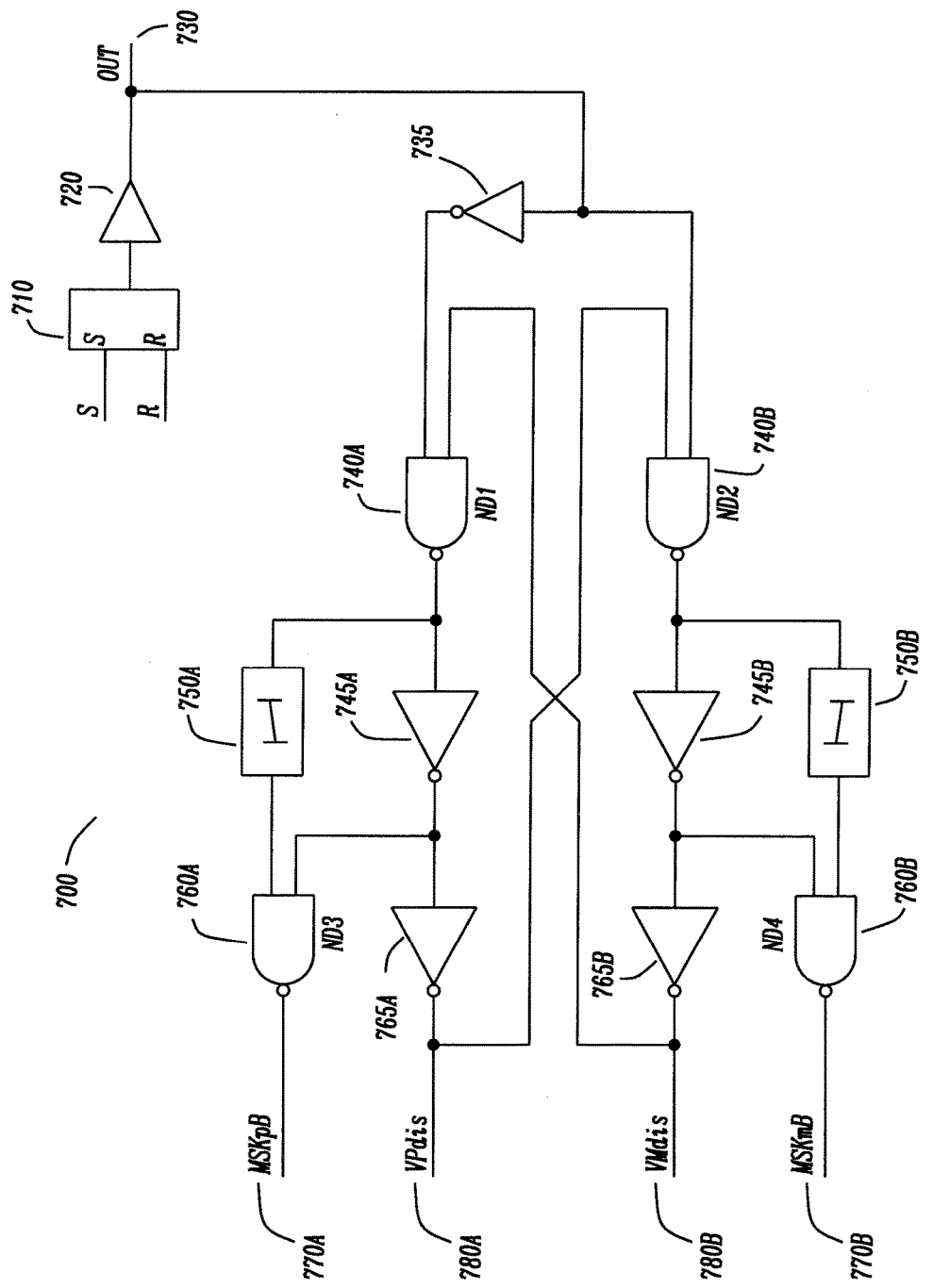
FIG. 7 is a digital circuit in accordance with a first embodiment of the disclosure.

FIG. 7 is a level shifter circuit digital core in accordance with a first embodiment of the disclosure. The level shifter circuit digital core 700 comprises a S-R flip-flop 710 coupled to a logic gate 720 and output 730. From OUT 730, four signals will be generated through a logic network. The logic network comprises an inverter 735, followed by a 2-input NAND gate 740A, and at its output an inverter 745A in parallel with a delay network 750A; these logic outputs are coupled to another two-input NAND 760A, and inverter 765A. From the second two input NAND gate 760A and inverter 765A, two signals will be generated, MSKpB 770A and VPdis 780A. A second parallel network will generate the other two signals. The logic network comprises by a 2-input NAND gate 740B, and at its output an inverter 745B in parallel with a delay network 750B; these logic outputs are coupled to another two-input NAND gate 760B, and inverter 765B. From the second two input NAND gate 760A and inverter 765A, two signals will be generated, MSKmB 770B and VMdis 780B. Feedback signals are fed back to the second inputs of the NAND gate 740A and 740B from signals VPdis 780A and VMdis 780B. NAND gates 740*a* and 740*b* combined with inverters 745A, 765A, 7458 and 765B make up an SR latch.

Figure 8:
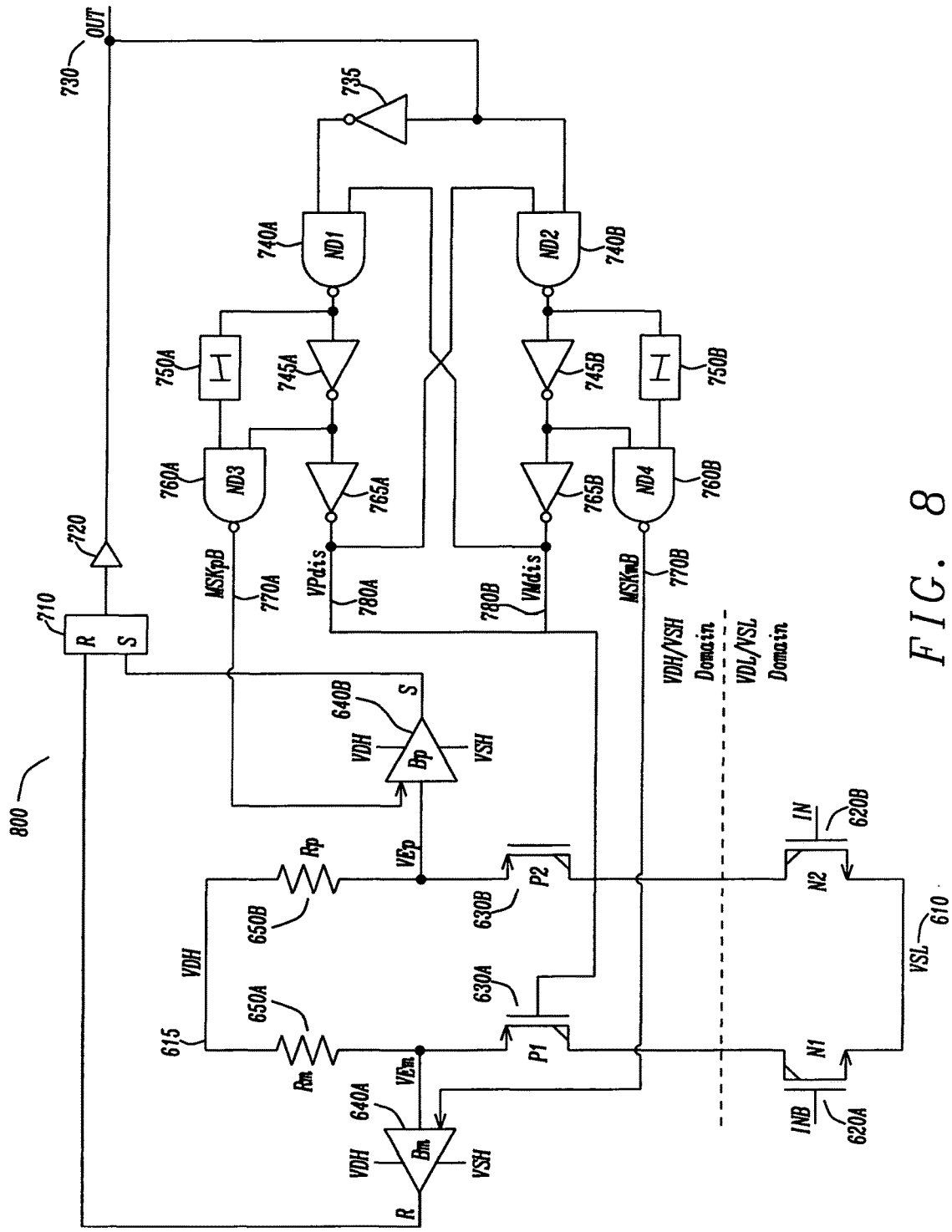
FIG. 8 is level shift circuit with digital and analog blocks in accordance with a first embodiment of the disclosure.

FIG. 8 is a level shifter circuit with integration of the digital and analog core 800 in accordance with a first embodiment of the disclosure. FIG. 8 illustrates the integration of the analog core (e.g. FIG. 6) and the digital core (e.g. FIG. 7). The level shifter circuit digital core comprises a S/R flip-flop 710 coupled to a logic gate 720 and output 730. From OUT 730, four signals will be generated through a logic network. The logic network comprises an inverter 735, followed by a 2-input NAND gate 740A, and at its output an inverter 745A in parallel with a delay network 750A; these logic outputs are coupled to another two-input NAND 760A, and inverter 765A. From the second two input NAND gate 760A and inverter 765A, two signals will be generated, MSKpB 770A and VPdis 780A. A second parallel network will generate the other two signals. The logic network comprises by a 2-input NAND gate 740B, and at its output an inverter 745B in parallel with a delay network 750B; these logic outputs are coupled to another two-input NAND 760B, and inverter 765B. From the second two input NAND gate 760A and inverter 765A, two signals will be generated, MSKmB 770B and VMdis 780B. Feedback signals are fed back to the second inputs of the NAND gate 740A and 740B from signals VPdis 780A and VMdis 780B. The analog block has a low level VSL 610 coupled to the n-channel MOSFETs N1 620A and N2 620B. These are coupled to p-channel MOSFETs P1 630A and P2 630B. In this network the gates of P1 630A and P2 630B are coupled to signals VMdis 780B and VPdis 780A, respectively. The gate-to-source capacitance of P1 630A and P2 630B is Cp1, and Cp2, respectively. Transistor P1 630A source is coupled to a resistor Rm 650A. Transistor P2 630B source is coupled to resistor Rp 650B. The source node between P1 630A and resistor Rm 650A is coupled to logic gate 640A providing an output signal R. The logic gate 640A receives signal MSKmB 770B. The source node between P2 630B and resistor Rp 650B is coupled to logic gate 640B providing an output signal S and signal MSKpB 770A. The power rail VDH 615 is coupled to the two resistors Rm 650A and Rp 650B. The logic gates 640A and 640B have masking signal inputs MSKmB 770B and MSKpB 770A. From the initial state where 'OUT' and 'IN' are logic low, the logic controller will assert VMdis and de-assert VPdis, in other words P2 630B is ready to conduct current and P1 630A is turned off, also the steady state for both MSKp 770A & MSKm 770B is logic low that is allowing the signal to propagate through buffers Bp and Bm. Note that MSKp and MSKm are logical signals that force the outputs of Bm and Bp are low when they are asserted. If the input signal, 'IN' is toggled to logic high since P2 630B is on, current will flow in Rp 650B, VEp will be driven low and a set signal 'S' signal will be generated, then P1 630A is still in off-state, meaning the 'R' signal is not asserted. The action of the set signal 'S' will toggle the S/R latch 710 to logic high which will cause VPdis 780A to be driven high and VMdis 780B to be driven low, turning on P1 630A and allowing it to be ready for the next transition. Another way of looking at the disclosure is to make an analogy between N2/P2 and an AND gate of which the inputs are signal IN and signal VPdisB with the output being the voltage across resistor Rp; this latter can increase to a logic high only if signal IN is logic high and signal VPdis is logic low (the latter is directly translating the state of the output voltage (OUT)). The same analogy could apply to the operation of transistor N1 620A and P1 630A with the inputs being this time signal INB and signal VMdisB and the output equal to the voltage across resistor Rm 650A. In both cases when voltage develop across either resistor Rp 650B or resistor Rm 650A it represents an error signal between the state of the output signal (OUT) and the state of the input signal (IN), the associated logic aims to bring the error to zero.

The operation of the positive and minus mask operation (MSKp and MSKn signals, respectively) is key to the embodiment. It is noted that the parasitic capacitances capacitance Cp1 and capacitance Cp2 (as shown in FIG. 6) will tend to produce a false reset, or set during any transition. Note that MOSFET P1 630A and MOSFET P2 630B are not small FETs (e.g, they are wide devices). Signals MSKp and MSKm are there to mask negative edge transitions of Vpdis and Vmdis. The masking does not affect propagation time because it applies to (a) the reset signal 'R' when the RS-flip flop is toggling to logic high, and (b) the set signal 'S' when the RS flip-flop logic block is toggling to logic low.

This operation is a d.c. level shift operation. In the operation, for any reason the output changes state and does not match the input signal state, an error signal will develop across either resistors Rp or Rm. This will cause the local feedback to correct it, and eliminate the error which results eventually into output matching the input state. The local feedback is not part of the main signal path, and as a result the propagation path from the input to the output is very short, leading to a small delay. As opposed to prior art using regenerative structures in the main path, the embodiment provides a truly symmetrical propagation since (a) the RS latch—if capacitive loading of parasitic routing capacitance Q & QB (introduced by different metal interfaces) are matched—will set and reset with equal propagation times, and (b) the rest ('R') and set ('S') generation paths are identical (see FIG. 6). Additionally, current is consumed only during the transition whilst the output and input are in different states, outside the transition phases current drained from both VDH and VDL is zero.

Figure 9:
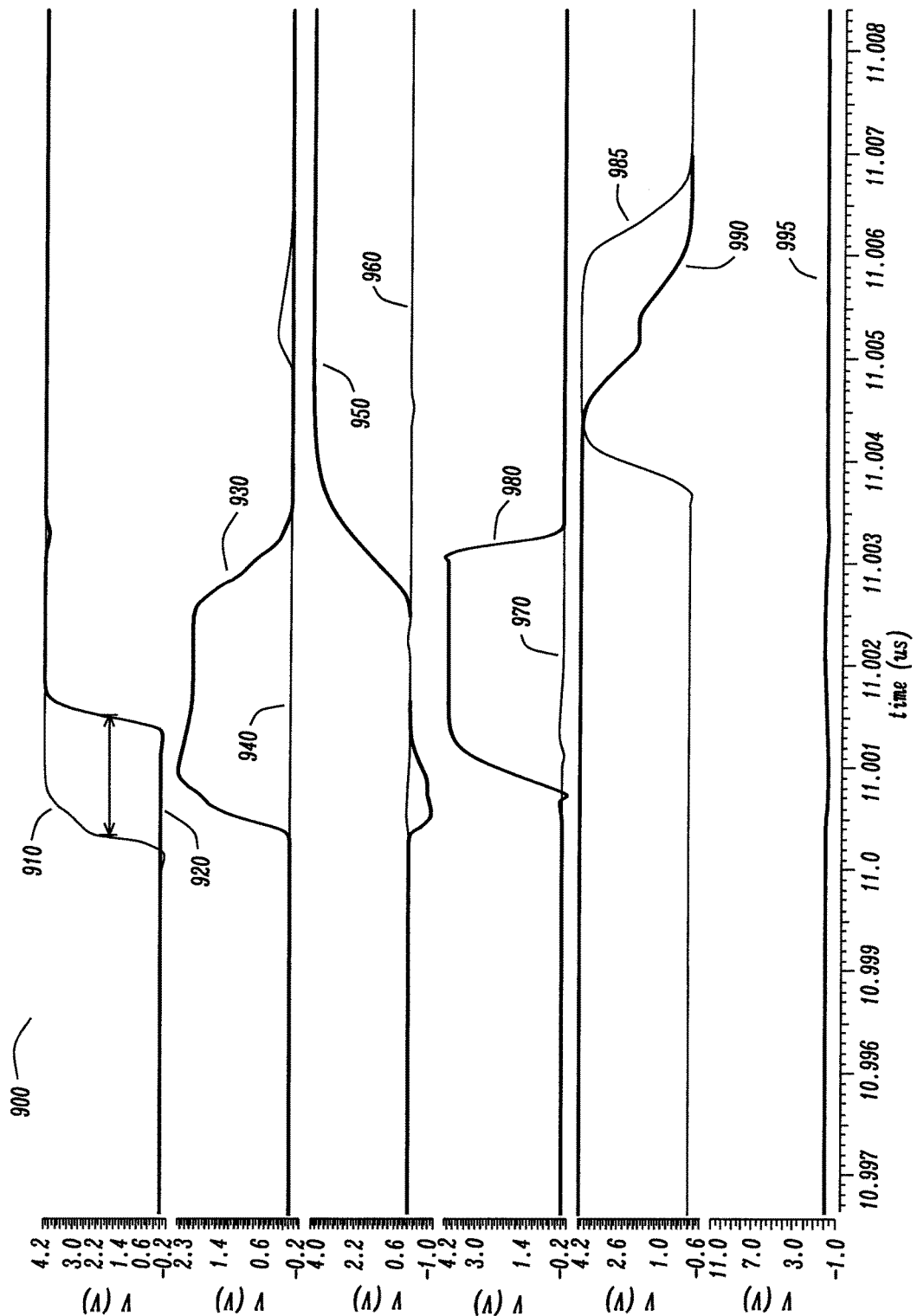
FIG. 9 is the timing diagram of the circuit of rising input with static VSH in accordance with a first embodiment.

FIG. 9 is the timing diagram of the circuit of rising input with static VSH in accordance with a first embodiment. The timing diagram 900 shows the signals of IN 910, OUT-VSH 920, VDH-VEm 930, VDH-VEp 940, VPdis 950, MSKp 960, R 970, S 980, MSKm 985, VMdis 990, VT ('*/VSSH') 995. FIG. 9 highlights the functional operation of the first embodiment. FIG. 9 illustrates the operation for the circuit when the input signal changes from a low to high state. The first event is change of signal 910 from a low to high state. VOH-Vep voltage increases and the RS latchup set signal "S" changes its state to match the input signal. The logic circuit will cause VPdis to rise to a high state and VMdis to go to a low state. When the latter happens, MSkn 985 prevents a secondary reset from reaching the latch and cause a loss of the desired state. Restating, as the input signal IN 910 rises, and with disable signal VPdis low so that P2 is ready to conduct, N2 turns on, causing current to flow through resistor Rp, and thus voltage VDH-Vep rises as shown by signal 930. With masking signal MSKpB low, the buffer Bp propagates a rising signal S 980 to set the SR latch 710, thus leading to output Out 920 rising. The rising out signal propagates through the digital logic to cause Vpdis 950 to rise. Subsequently VMdis 990 falls, setting up P1 to be ready to conduct current on the next change to the input from high to low.

Figure 10:
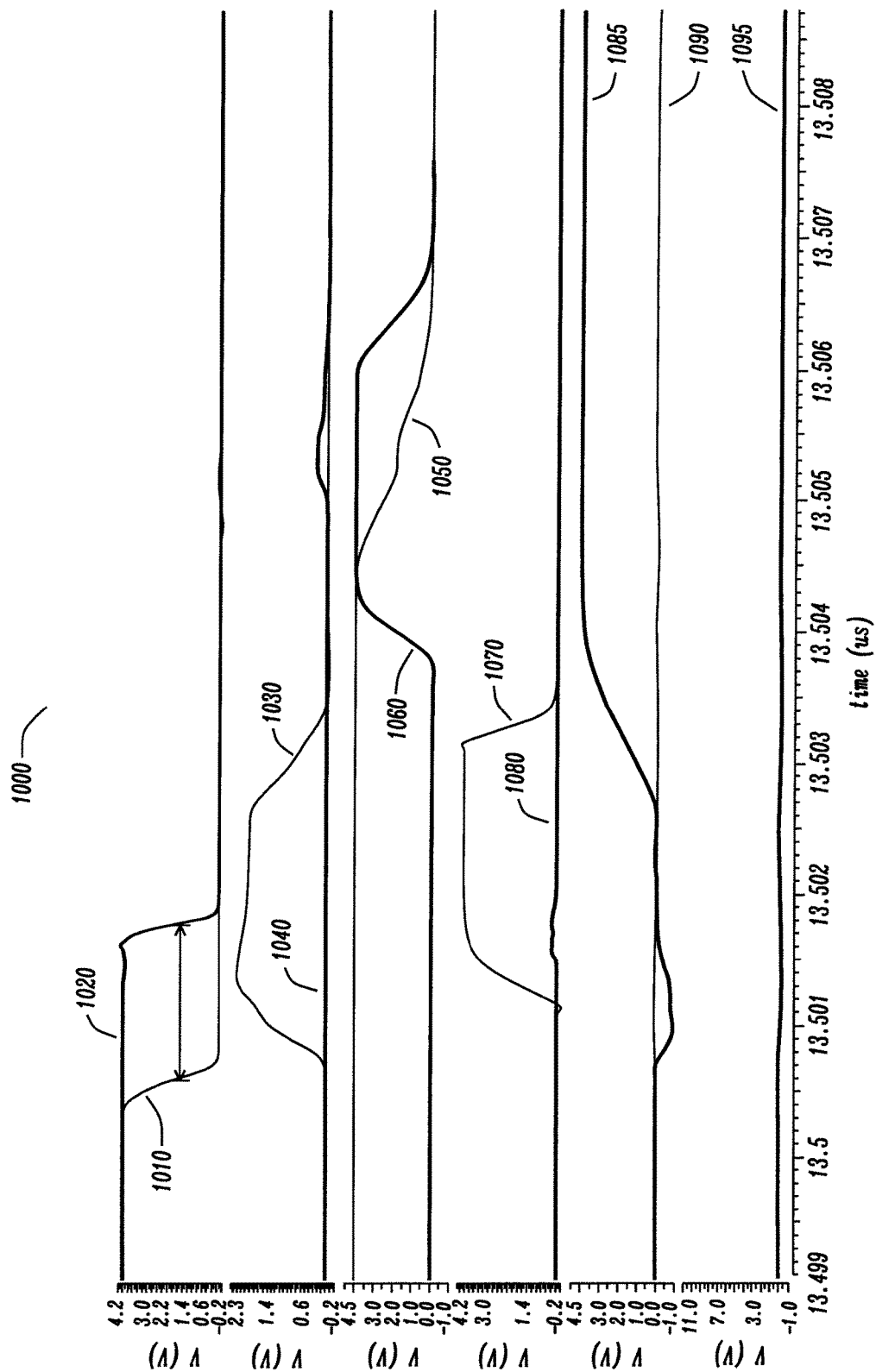
FIG. 10 is the timing diagram of the circuit of falling input with static VSH in accordance with a first embodiment.

FIG. 10 is the timing diagram of the circuit of falling input with static VSH in accordance with a first embodiment. The timing diagram 1000 shows the signals of IN 1010, OUT-VSH 1020, VDH-VEm 1030, VDH-VEp 1040, VPdis 1050, MSKp 1060, R 1070, S 1080, MSKm 1085, VMdis 1090, VT (*/VSSH') 1095. The circuit operates symmetrically and similarly as described above with regard to FIG. 9. FIG. 10 illustrates the operation of the circuit when the input signal changes state from high to low. The first event is the change from low to high VOH-VEm voltage increases and the RS latch reset signal "R" changes its statto match the input signal. The logic circuit will cause VMdis 1090 to transition from to a high state, and VPdis to a low state. When the latter occurs, MSKp 1060 prevents a secondary set from reaching the latch and cause a loss of the desired state.

Figure 11:
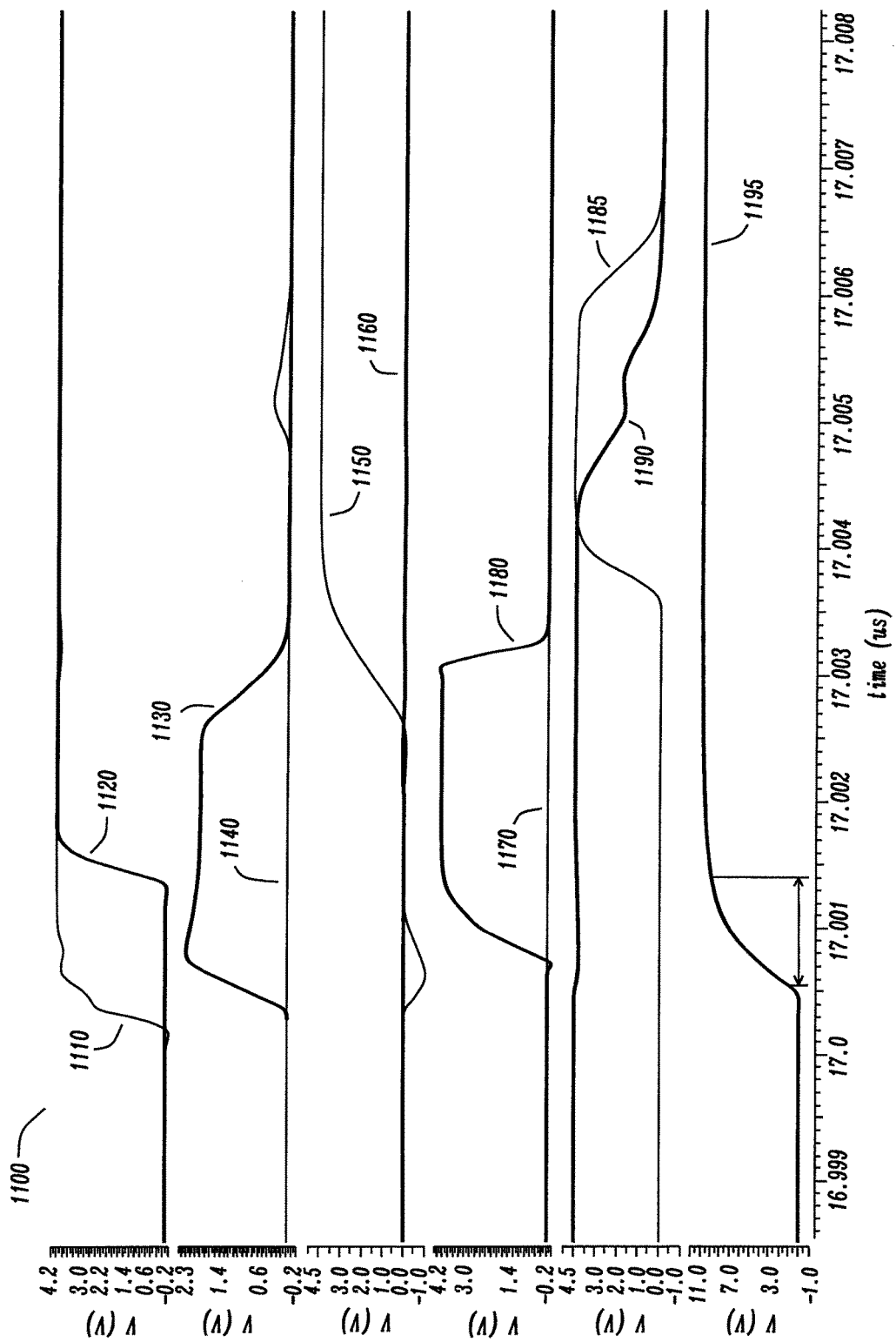
FIG. 11 is the timing diagram of the circuit of rising input with fast rising VSH at 1 ns in accordance with a first embodiment.

FIG. 11 is the timing diagram of the circuit of rising input with fast rising VSH at approximately 10 V per 1 ns. The timing diagram 1100 shows the signals of IN 1110, OUT-VSH 1120, VDH-VEm 1130, VDH-VEp 1140, VPdis 1150, MSKp 1160, R 1170, S 1180, MSKm 1185, VMdis 1190, VT (*/VSSH') 1195. As can be seen in comparing FIG. 11 to FIG. 13, circuit operations are nearly the same even with a fast rising VSH. FIG. 11 illustrates the immunity of the level shifter to very fast transitions of the supply rails. In this example, VSH and VDH are making a very fast positive transition 10V in 1 ns while the signal at the input is changing state.

Figure 12:
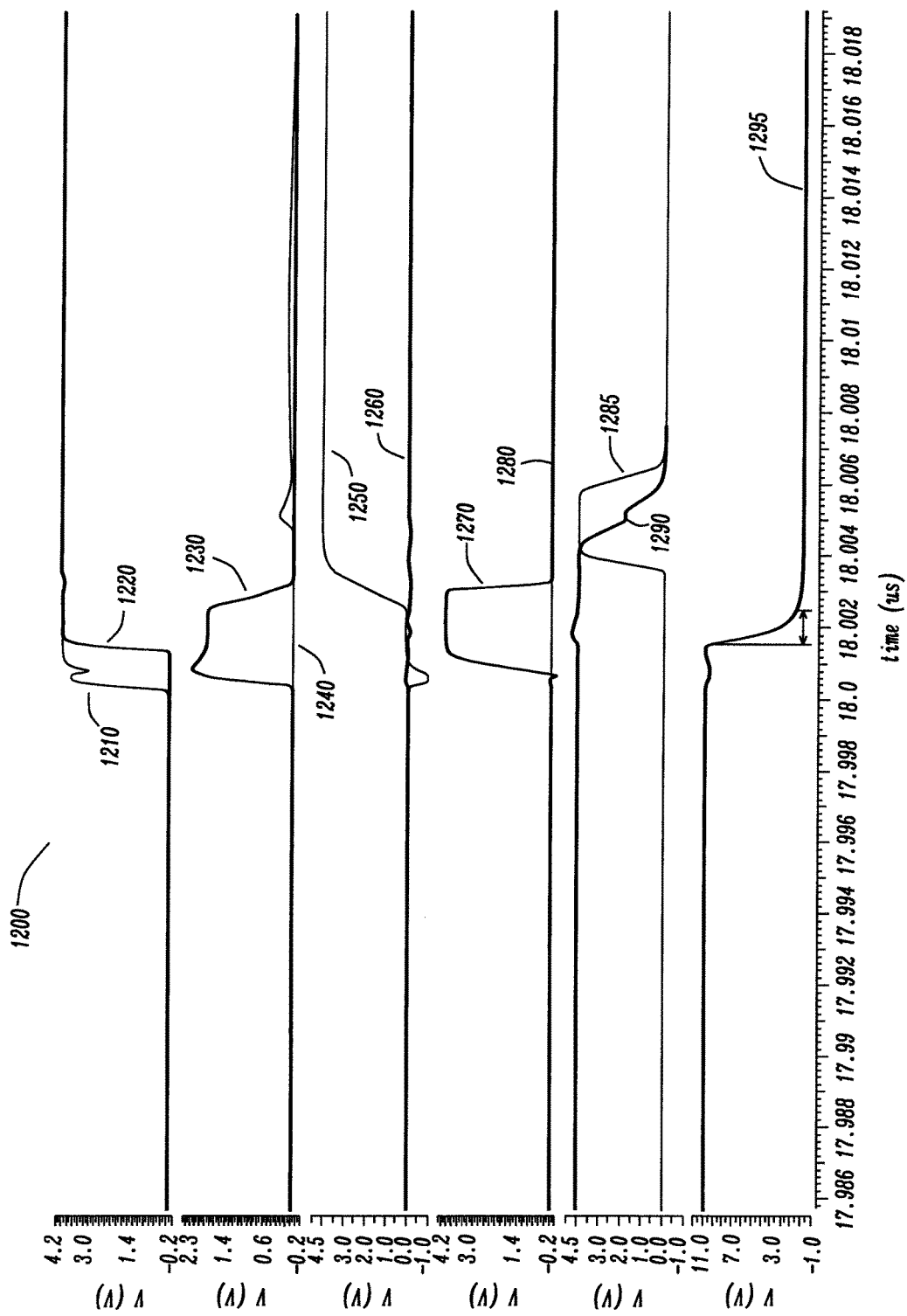
FIG. 12 is the timing diagram of the circuit of falling input with fast rising VSH at 1 ns in accordance with a first embodiment.

FIG. 12 is the timing diagram of the circuit of falling input with fast rising VSH at 1 ns in accordance with a first embodiment. The timing diagram 1200 shows the signals of IN 1210, OUT-VSH 1220, VDH-VEm 1230, VDH-VEp 1240, VPdis 1250, MSKp 1260, R 1270, S 1280, MSKm 1285, VMdis 1290, VT (*/VSSH') 1295. Although the horizontal scale differs from that used in FIGS. 11-13, circuit operation and timing as shown in FIG. 14 is similar to that shown in the earlier figures.

Figure 13:
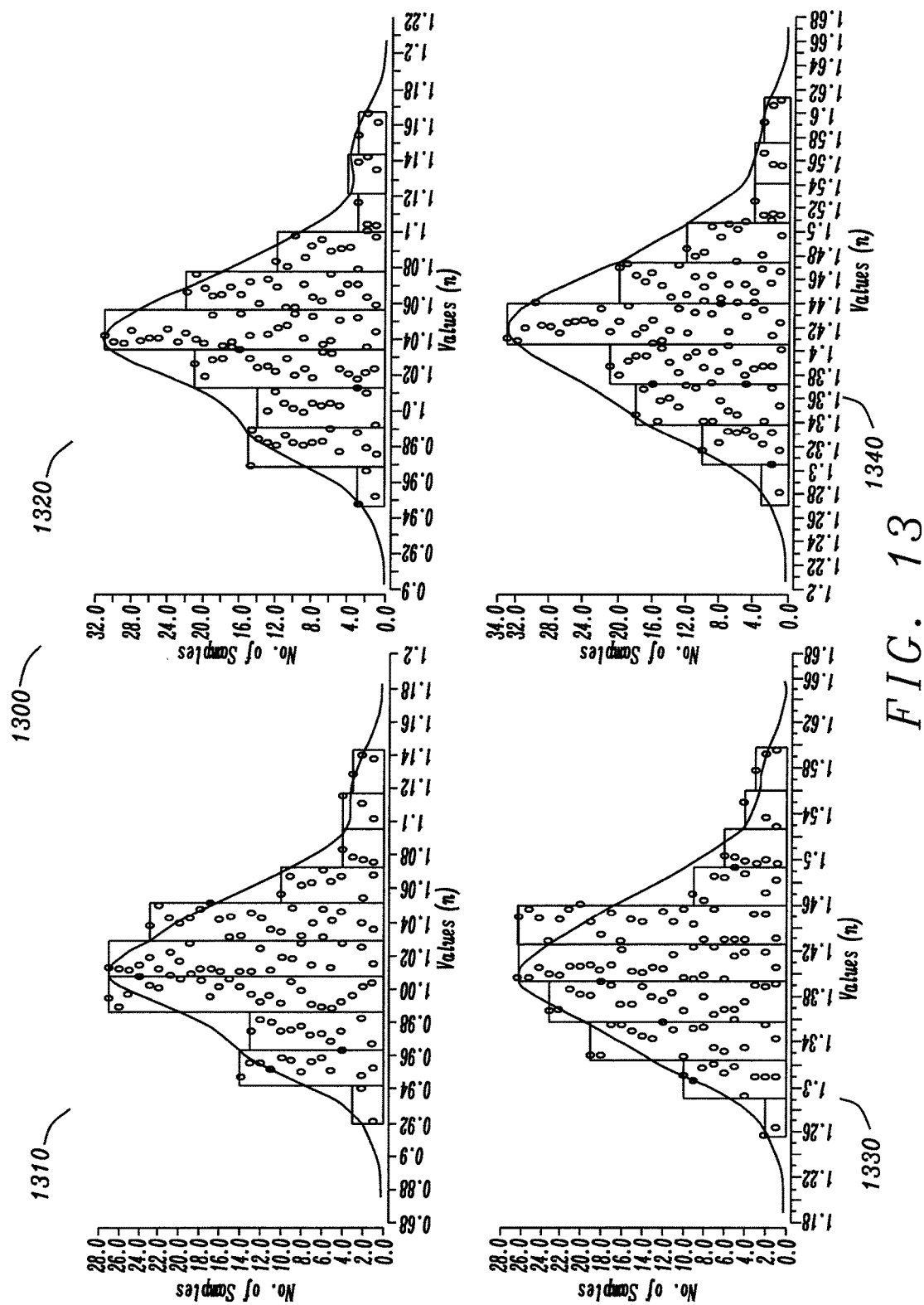
FIG. 13 is the propagation time distribution versus temperature, process, and mismatch of the circuit in accordance with a first embodiment; and, FIG. 14 is a method of operation of a level shift circuit in accordance with a first embodiment of the disclosure.

FIG. 13 is the propagation time distribution versus temperature, process, and mismatch of the circuit in accordance with a first embodiment. The propagation time distribution 1300 is shown as four plots 1310, 1320, 1330, and 1340. The simulation illustrates the ultra-fast operation and the stability of the results with the temperature and process corners.

Figure 14:
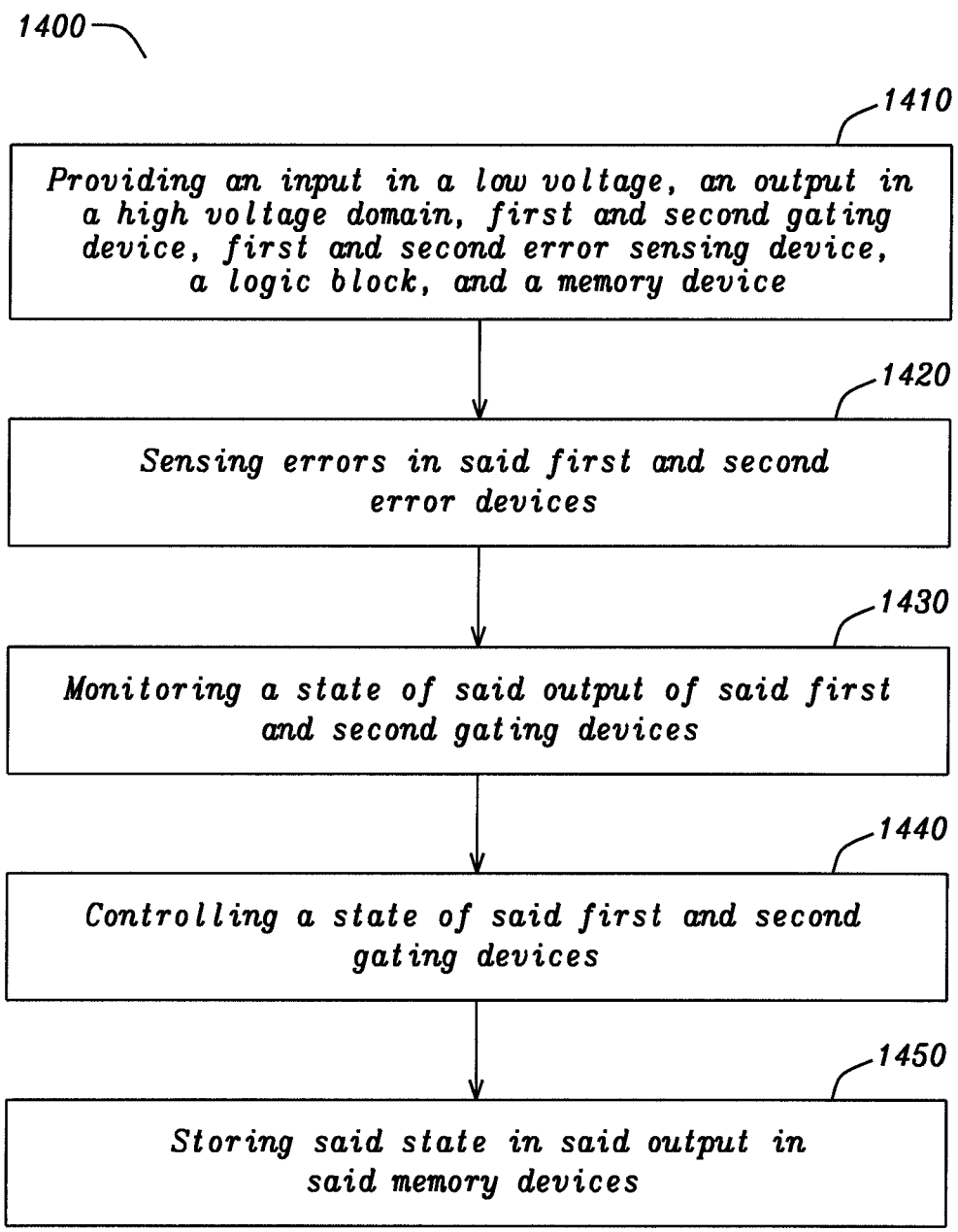

FIG. 14 is a method of operation of a level shift circuit in accordance with a first embodiment of the disclosure. The method of a level shift circuit 1400, comprising the steps of a first step 1410 (a) providing an input in a low voltage domain, an output in a high voltage domain, first and second gating device, first and second error sensing device, a logic block, and a memory device, a second step 1420 (b) sensing errors in said first and second error devices, third step 1430 (c) monitoring a state of said output of said first and second gating devices, fourth step 1440 (d) controlling a state of said first and second gating devices; and, a fifth step 1450 (e) storing said state of said output in said memory device.

It should be noted that the description and drawings merely illustrate the principles of the proposed methods and systems. It will thus be appreciated that those skilled in the art will be able to devise various arrangements that, although not explicitly described or shown herein, embody the principles of the invention and are included within its spirit and scope It should be noted that the description and drawings merely illustrate the principles of the proposed methods and systems. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the proposed methods and systems and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Other advantages will be recognized by those of ordinary skill in the art. The above detailed description of the disclosure, and the examples described therein, has been presented for the purposes of illustration and description. While the principles of the disclosure have been described above in connection with a specific device, it is to be clearly understood that this description is made only by way of example and not as a limitation on the scope of the disclosure.

What is claimed is:

1. A level shift circuit, comprising:
   an input in low voltage domain and an output in a high voltage domain;
   first and second gating device coupled to said input;
   first and second error sensing devices coupled to a said first and second gating devices, respectively;
   a logic block configured to monitor a state of said output and to control of said first and second gating devices; and
   wherein said first and second error sensing devices are coupled to a memory device configured to store said state of said output.

2. The level shift circuit of claim 1, comprising an analog block which comprises:
   first and second n-channel MOSFET devices configured to be controlled by a signal at said input;
   said first and second gating device connected to drains of said first and second n-channel devices, respectively, wherein said first and second gating devices are configured to receive first and second disable signals from said logic block.

3. The level shift circuit of claim 2, wherein said analog block further comprises said first and second error sensing devices, which are resistors.

4. The level shift circuit of claim 2, wherein said analog block further comprises first and second buffers configured to be masked by first and second masking signals from said logic blocks, wherein each of said buffers is connected between one of said error sensing devices and one of said gating devices.

5. The level shift circuit of claim 1, wherein said logic block comprises:
   a first two-input NAND gate coupled to said output;
   an inverter followed by a second two-input NAND gate wherein said inverter is coupled to said output;
   a first time delay element and second inverter coupled to the output of said first two input NAND;
   a second time delay element and third inverter coupled to the output of said second two input NAND;
   a third two-input NAND whose two inputs are electrically coupled to said first time delay element and said second inverter and configured to provide said first masking signal;

a fourth two-input NAND whose two inputs are electrically coupled to said second time delay element and said third inverter and configured to provide said second masking signal;

a fourth inverter electrically coupled to said second inverter and providing an output signal to said second two-input NAND and providing said a first disable signal; and, a fifth inverter electrically coupled to said third inverter and providing an output signal to said first two-input NAND and providing said a second disable signal.

6. The level shift circuit of claim 4 further comprising an RS flip flop wherein said first and second buffers are connected to Reset and Set inputs of said RS flip flop, and wherein an output of said RS flip flop is a level shifted output.

7. The level shift circuit of claim 2 wherein sources of said first and second n-channel MOSFET devices are connected together to a lower voltage of said lower voltage domain, and wherein said input of said level shift circuit is connected to gates of said first and second n-channel devices.

8. A method of operating a level shift circuit, comprising the steps of:
providing an input in a low voltage domain, an output in a high voltage domain, first and second gating device, first and second error sensing device, a logic block, and a memory device;
sensing errors in said first and second error sensing devices;
monitoring a state of said output of said first and second gating devices;
controlling a state of said first and second gating devices; and,
storing said state of said output in said memory device.

9. The method of operating a level shift circuit of claim 8, further comprising an analog block which comprises first and second n-channel MOSFET devices configured to be controlled by a signal at said input.

10. The method of operating a level shift circuit of claim 9, further comprising said first and second gating device connected to drains of said first and second n-channel devices, respectively, wherein said first and second gating devices are configured to receive first and second disable signals from said logic block.

11. The method of operating a level shift circuit of claim 8, wherein said analog block further comprises said first and second error sensing devices, which are resistors.

12. The method of operating a level shift circuit of claim 8, wherein said analog block further comprises first and second buffers configured to be masked by first and second masking signals from said logic blocks, wherein each of said buffers is connected between one of said error sensing devices and one of said gating devices.

13. The method of operating a level shift circuit of claim 8, further comprises the step of applying two gate signals to the to a first and second p-channel MOSFET of said analog block.

14. The method of operating a level shift circuit of claim 8, further comprises the step providing to mask signals MSKpB and MSKmB to a first and second logic gate in an analog circuit.

15. The method of operating a level shift circuit of claim 8, further comprises the step of outputting a signal from the first and second logic gate of an analog circuit to an RS flip-flop logic gate.

16. The method of operating a level shift circuit of claim 8, further comprises the step of outputting a signal to the output from the RS flip-flop logic gate.

* * * * *